(12) United States Patent
Ghantiwala

(10) Patent No.: US 6,968,890 B1
(45) Date of Patent: Nov. 29, 2005

(54) HEAT SINK

(75) Inventor: Nayana V. Ghantiwala, San Jose, CA (US)

(73) Assignee: Apple Computer, Inc., Cupertino, CA (US)

( * ) Notice: Subject to any disclaimer, the term of this patent is extended or adjusted under 35 U.S.C. 154(b) by 0 days.

(21) Appl. No.: 10/460,629

(22) Filed: Jun. 11, 2003

(51) Int. Cl.[7] .............................................. F28D 15/00
(52) U.S. Cl. ................ 165/104.21; 165/80.3
(58) Field of Search ................. 165/104.33, 104.21, 165/104.26, 80.3, 185; 361/687, 689, 690, 361/698, 699, 700, 703, 704; 257/714, 722; 174/15.2

(56) References Cited

U.S. PATENT DOCUMENTS

| | | | | |
|---|---|---|---|---|
| 4,588,023 A | * | 5/1986 | Munekawa | 165/104.33 |
| 5,038,858 A | * | 8/1991 | Jordan et al. | 165/185 |
| 5,329,993 A | * | 7/1994 | Ettehadieh | 165/104.14 |
| 6,397,941 B1 | * | 6/2002 | McCullough | 165/185 |
| 6,407,922 B1 | * | 6/2002 | Eckblad et al. | 361/704 |
| 6,424,528 B1 | * | 7/2002 | Chao | 361/700 |
| 6,466,441 B1 | * | 10/2002 | Suzuki | 361/695 |
| 6,633,484 B1 | * | 10/2003 | Lee et al. | 361/697 |
| 6,666,260 B2 | * | 12/2003 | Tantoush | 165/80.3 |

FOREIGN PATENT DOCUMENTS

JP          55065891 A   *   5/1980 ............ F28D 15/00

OTHER PUBLICATIONS

"Therma-Loop ™:Loop Heat Pipes and Loop Thermosyphons" product description, from http://www.thermacore.com/thermaloop.htm printed from internet Jun. 8, 2005 pp. 1-4.

"037862 (superceded by 037888) P4 4-U High Perfomance Heat Sink for Use With the Pentium 4 Processor ™"(423 Pin, Xeon, Foster, Prestonia, Gallatin) product description, from http://www.aavidthermalloy.com/products/microp/037862 4u.shtml printed from internet Jun. 8, 2005 pp. 1-2.

"Therma-Tower TM" product decription, from http://www.thermacore.com/therma tower.htm printed from internet Jun. 8, 2005 pp. 1-2.

* cited by examiner

Primary Examiner—Tho Duong
(74) Attorney, Agent, or Firm—Blakely, Sokoloff, Taylor & Zafman LLP

(57) ABSTRACT

In one exemplary embodiment of the present invention, a heat sink having an embedded heat pipe and fins attached to opposite sides of the base plate. In an alternative embodiment, the base plate includes a main heat pipe and auxiliary heat pipes coupled to the main heat pipe. The fins are aligned with the auxiliary heat pipes.

4 Claims, 15 Drawing Sheets

HEAT SINK

TECHNICAL FIELD

The invention relates generally to heat removal devices, and more particularly to a heat sink for electronic components.

BACKGROUND

Electronic components are capable of generating undesirable levels of heat during operation. For example, microprocessors in computer systems can generate enough heat that they can either slow down or cease to function if heat is not removed. Moreover, higher transistor count on a smaller die area and increasing frequencies of operation clocks have further increased the heat produced by microprocessors. Maintaining actual junction temperatures within a reliable junction value is critical to support higher frequencies and to secure the normal functioning of the electronic components. Thus, dissipation of the heat produced by such electronic components is important to stabilize their operation and extend their operational life.

Existing heat removal devices, such as a fan, employ forced convention. Some electronic systems use one large fan to cool all of the heat producing components within a system. Other electronic systems have individual fans for each heat producing element. However, fans often generate unacceptable levels of noise and require separate power sources. Moreover, because fans utilize moving parts, they are susceptible to mechanical failure.

Other heat removing devices employ natural convention in which a heat produced by electronic components is dissipated by a heat sink. Prior art heat sinks include heat dissipation fins attached to a base plate. The base plate is meant to spread out the heat produced by the heat producing element to all the fins. FIG. 1A illustrates a prior art heat sink that includes many thin plates and pins disposed on a base plate. These heat sinks are constructed of materials having high thermal conductivity such as aluminum and copper. Heat produced by the heat producing element is conducted to the heat dissipation fins via the thermally conductive base section or base plate. The heat is then transferred over the surface of the heat dissipation fins and dissipated into the air blown by a cooling fan.

In order to improve the performance of the cooling device, heat is most desirably distributed evenly throughout the base plate, and dissipated through all of the heat dissipation fins. However, as illustrated in FIG. 1B, heat emitted from the heat producing element tends to be conducted predominantly to the heat dissipation fins disposed right above the heat producing element, and the amount of heat conducted to the peripheral heat dissipation fins is relatively small. Because the heat producing element is much smaller than the base plate, the contact area between them is also very limited. Consequently, the fins as a whole dissipate heat very inefficiently. Moreover, the heat sink is very large relative to the heat source, placing undesirable constraints on the design of a product with high heat generation density.

Thus, to help ensure the continuing safe performance of heat generating electronic components, it is desirable to remove heat from such components in a quiet, efficient and reliable manner. Particularly, what is needed is a heat sink having a highly conductive base plate that maximizes heat dissipation along the entire length and width of the base plate and fins. The thermal properties of such a base plate would enable cooling of components with extremely high heat flux.

SUMMARY

Embodiments of a heat sink having at least one embedded heat pipe and fins attached to opposite sides of the base plate are described. In one embodiment, the base plate includes a main heat pipe and auxiliary heat pipes coupled to the main heat pipe. The fins are aligned with the auxiliary heat pipes.

There are numerous other embodiments which are described herein, and these embodiments generally relate to heat sinks that provide efficient heat dissipation for use in computer systems.

BRIEF DESCRIPTION OF THE DRAWINGS

The present invention is illustrated by way of example, and not limitation, in the figures of the accompanying drawings in which.

DETAILED DESCRIPTION

In the following description, numerous specific details are set forth such as examples of specific components, circuits, processes, etc., in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

The term "coupled" as used herein means connected directly to or indirectly connected through one or more intervening components, structures or elements. The terms "above," "below," and "between" as used herein refer to a relative position of one component or element with respect to other components or elements. As such, one component disposed above or below another component may be directly in contact with the other component or may have one or more intervening component. Moreover, one component disposed between other components may be directly in contact with the other components or may have one or more intervening components.

Embodiments of a heat sink are described. In one embodiment of the present invention, the heat sink is adapted for use in computer assemblies, such as desktop or personal computer systems. In alternative embodiments, the heat sink may be adapted for use with laptops, cell phones, and handheld computers. The heat sink includes a base plate and multiple fins coupled to opposite sides of the base plate. The double-sided fin configuration maximizes the heat dissipated through the base plate by allowing simultaneous axial and lateral heat transmission to all the attached fins. The base plate and fins are made of high heat conducting materials. The base plate also includes one or more embedded heat pipes to form a network that provides greater heat conductivity. Thus the combination of materials, fin orientation, and heat pipes results in a heat sink that can handle the high heat flux challenges in contrast to the prior art.

Figure 1A:
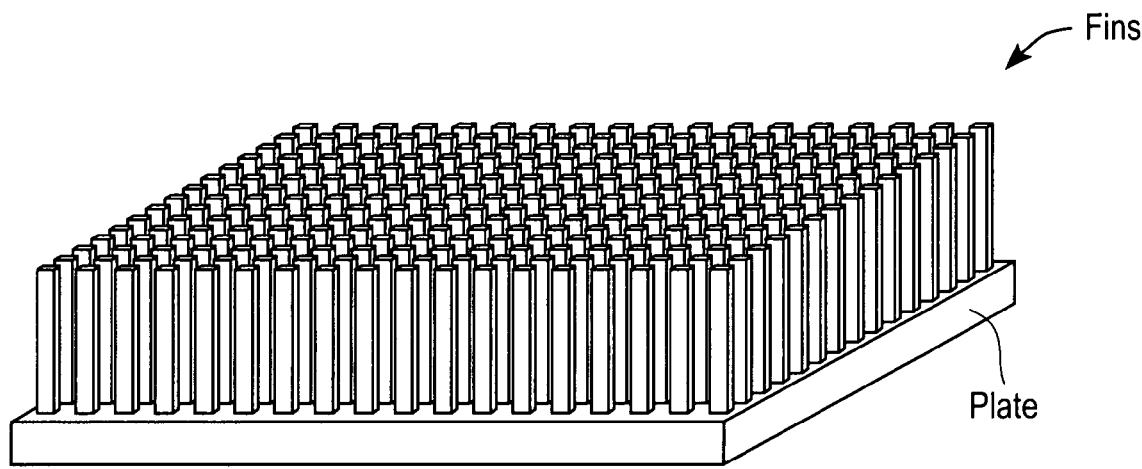
FIG. 1A illustrates a prior art heat sink.
Figure 1B:
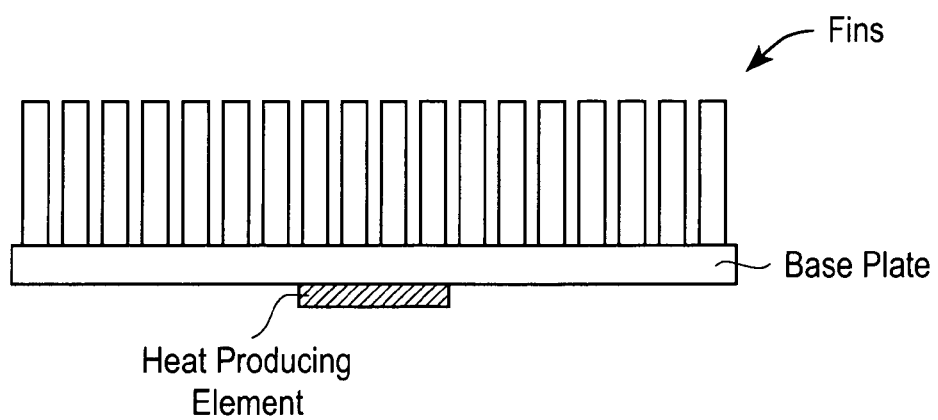
FIG. 1B illustrates another prior art heat sink.
Figure 2:
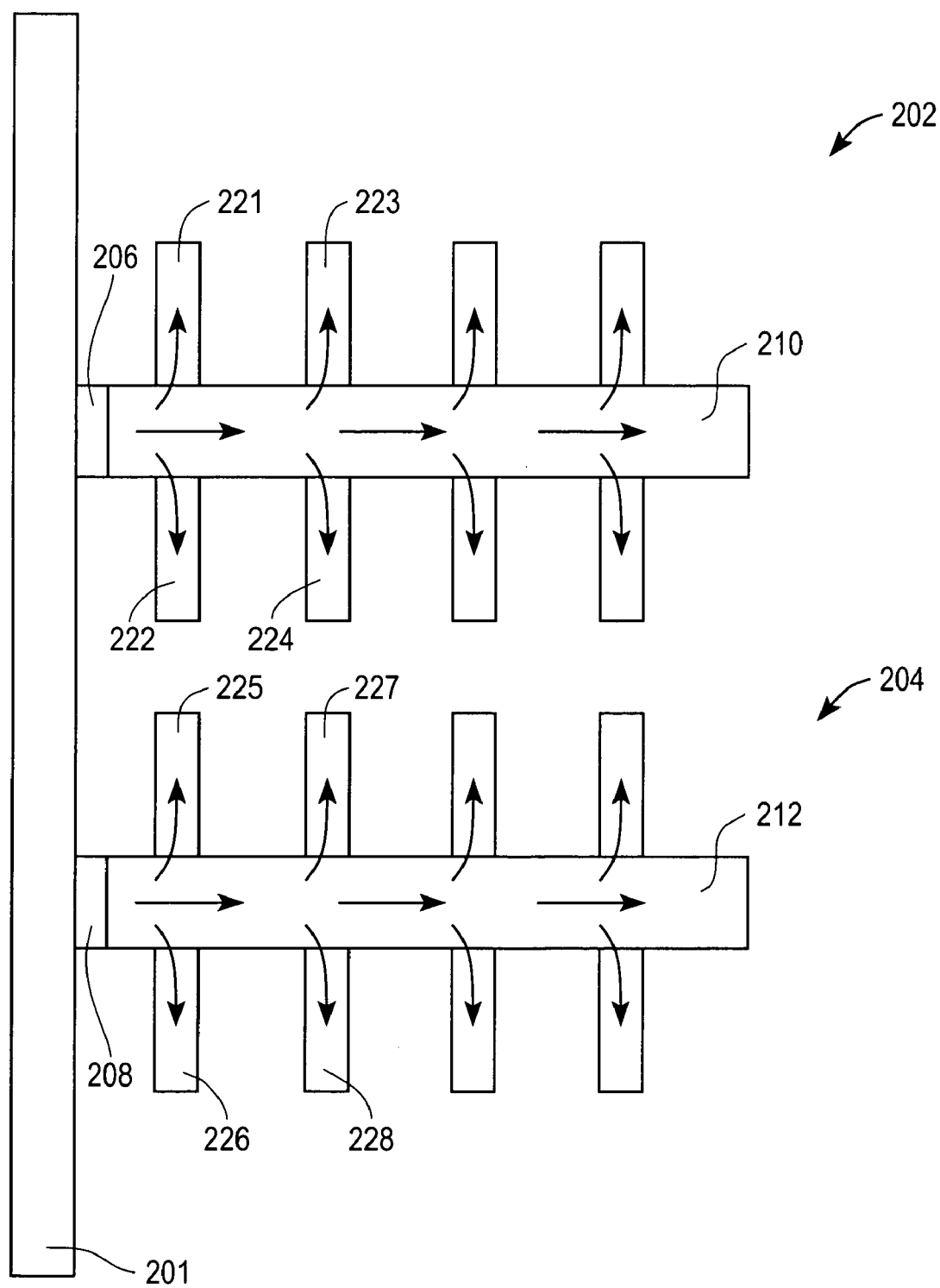
FIG. 2 illustrates one embodiment of a heat sink.

FIG. 2 illustrates one embodiment of a heat sink that may be used to dissipate heat from electronic components, for example, a microprocessor on a printed circuit board ("PCB") in a computer system (e.g., a motherboard). Typically, PCBs have heat producing elements such as microprocessors or power supplies mounted on one or more surfaces. FIG. 2 illustrates two heat generating sources in the form of central processing units ("CPUs") 206 and 208 disposed on a motherboard 201. Motherboard 201 is oriented vertically as would be mounted, for example, in a tower case or chassis of a computer system. Heat sink 202 is disposed over heat source 206 and heat sink 204 is disposed over heat source 208. Each heat sink has a centralized base plate (210, 212) with fins extending from opposite sides of the centralized base plate. The double sided array of fins for heat sink 202 is represented by fins 221 through 224, and the double sided array of fins for heat sink 204 is represented by fins 225 through 228. In one embodiment of the present invention, the double sided fins disposed on a centralized base plate (e.g., 210) provide efficient heat transport through the base plate, and through fins that extend along a flow length of the base plate for maximum heat transfer. As indicated by the arrows for heat sinks 202 and 204, the heat path starts from the heat source and extends to all the fins. As described in greater detail below, alternative embodiments for heat sinks 202 and 204 may have a network of heat pipes embedded within the base plate to further increase the dissipation of heat through the heat sink. FIG. 2 illustrates the use of two heat sinks for a dual processor system, although embodiments of a heat sink described herein may be utilized with any number of CPUs that are part of a computer system.

Figure 3A:
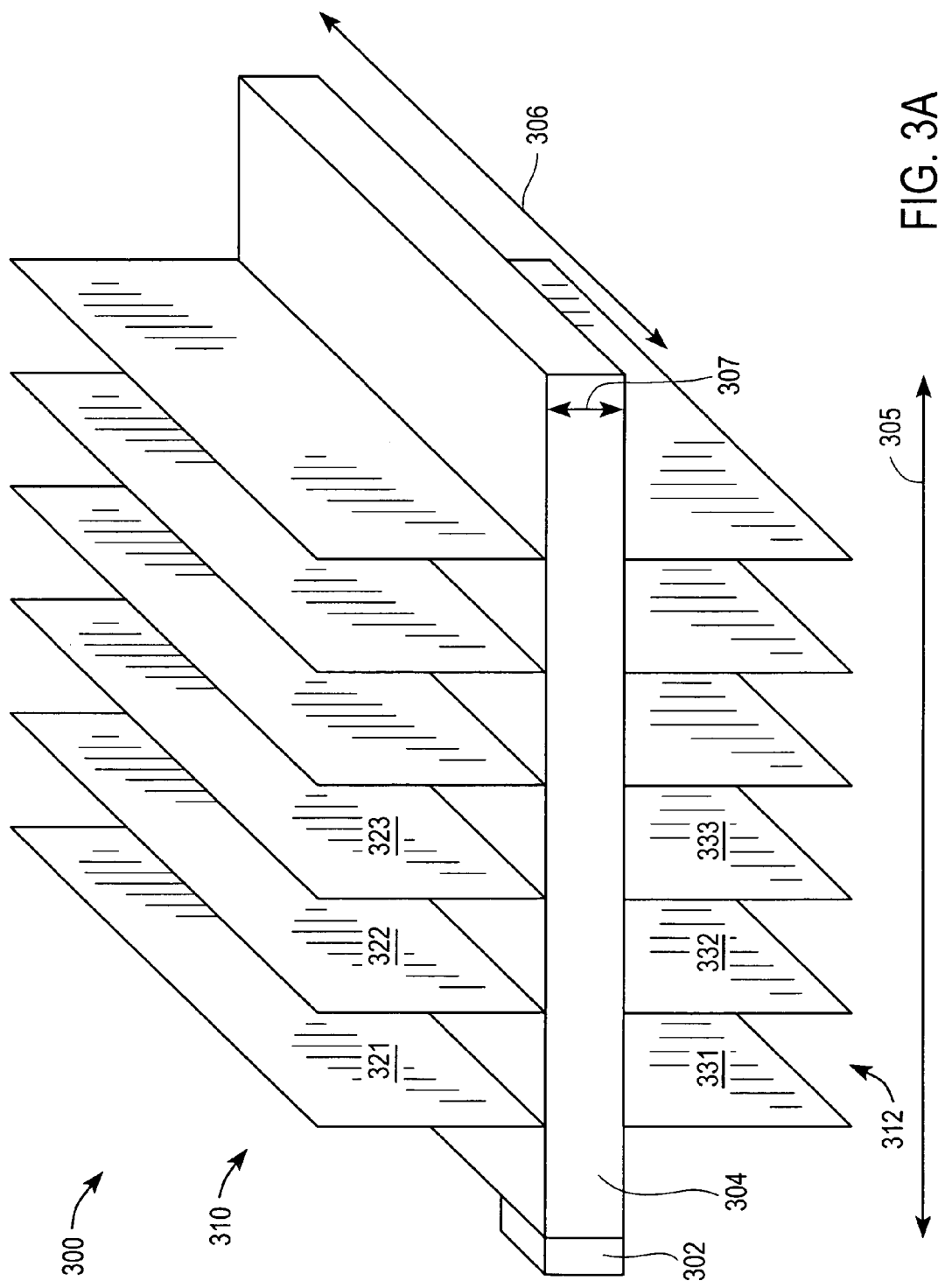
FIG. 3A illustrates a perspective view of one embodiment of a heat sink.

FIGS. 3A–3D illustrate various views of one embodiment of the present invention. FIG. 3A illustrates a perspective view of heat sink 300 having a base plate portion 304 with fin arrays 310 and 312 disposed on opposite sides of base plate 304. A spreader plate 302 may be disposed near one end of base plate 304. The spreader plate 302 may also be referred to as a "slug" or "heat spreader." The spreader plate is designed to conduct the heat produced by a heat producing element to the heat sink. In one embodiment of the present invention, spreader plate 302 may be made of copper. Spreader plates are known in the art; accordingly, a detailed description is not provided herein.

Figure 3B:
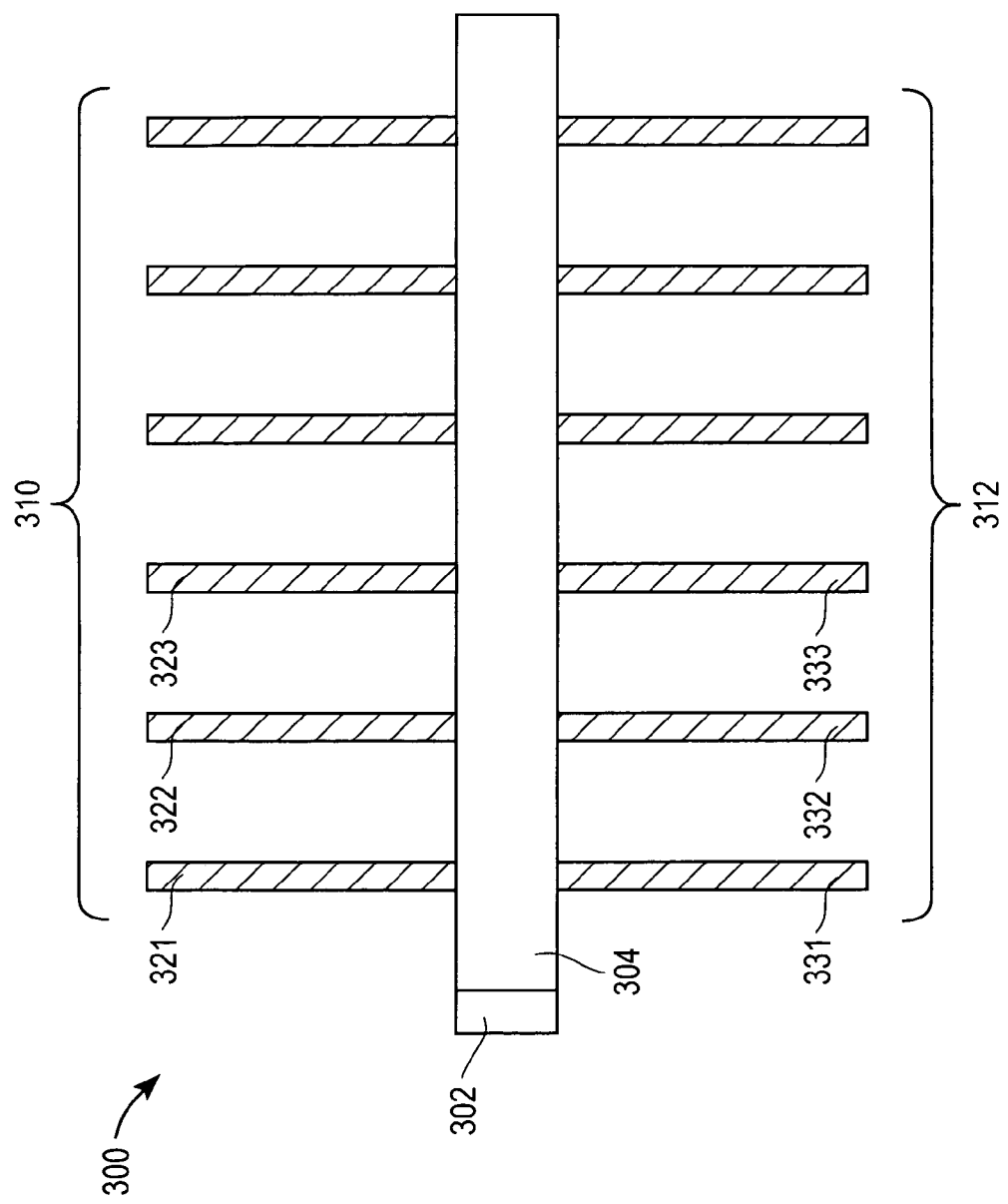
FIG. 3B illustrates a front view of one embodiment of a heat sink.
Figure 3C:
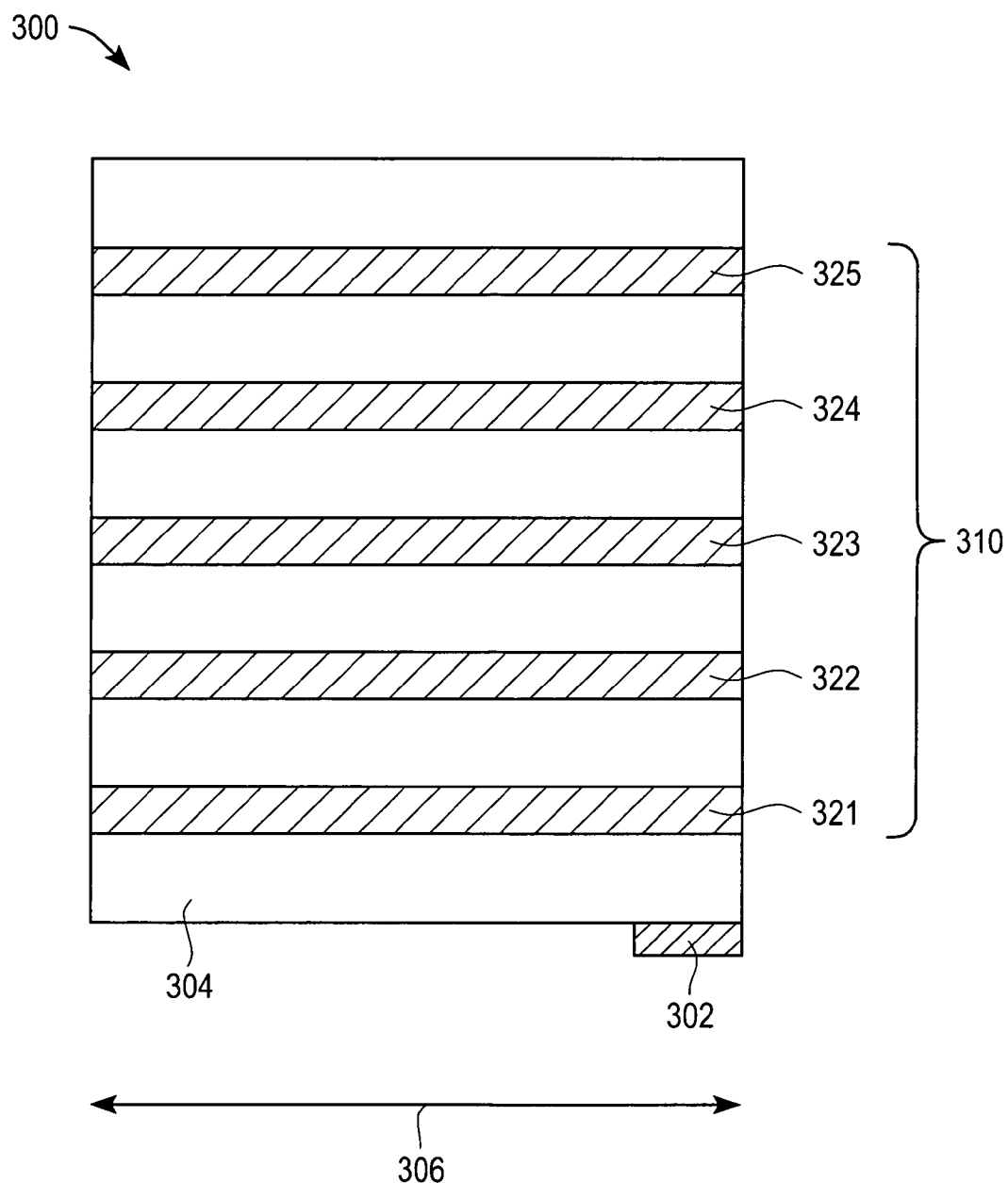
FIG. 3C illustrates a top view of one embodiment of a heat sink.
Figure 3D:
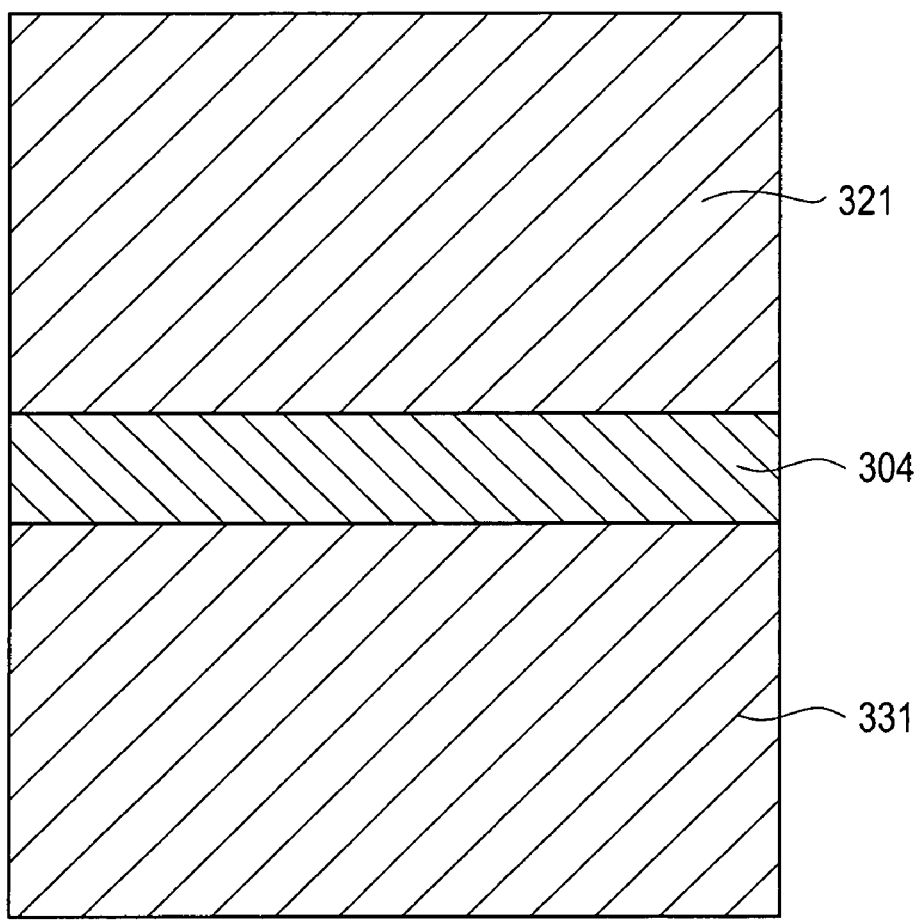
FIG. 3D illustrates a side view of one embodiment of a heat sink.

In one embodiment of the present invention, base plate 304 may be substantially rectangular in shape, with base plate 304 having a width 305, a heat flow length 306, and a thickness 307. The perspective view of FIG. 3A and the front view of FIG. 3B illustrate heat sink 300 with an array of fins (e.g., 310, 312) disposed on opposite sides of base plate 304. The group of fins 310 represented by fins 321, 322, and 323 are coupled to base plate 304 in an orientation that is substantially perpendicular to base plate 304. In one embodiment of the present invention, the fins may be disposed perpendicularly in a series along an entire width 305 of the base plate 304. As illustrated by FIG. 3C, which shows a top view of heat sink 300, each fin (321–325) may have a heat flow length substantially similar to the flow length 306 of base plate 304. FIG. 3D illustrates a side view of heat sink 300 with fins 321, 331 disposed on opposite sides of base plate 304. In one embodiment of the present invention, fins 321, 331 may be substantially the same size and shape. With respect to FIGS. 3A–3D, heat sink 300 may be oriented such that spreader plate 302 is coupled to a heat source such as CPU. In this orientation, heat sink 300 extends perpendicularly from the CPU disposed on a motherboard, with the fins oriented parallel to the motherboard and the CPU (similar to heat sinks 202, 204 of FIG. 2).

In one embodiment of the present invention, base plate 304 and fins 310, 312 may be made of a high-heat conducting material such as aluminum or copper. In an alternative embodiment, base plate 304 may be made of pyrolytic graphite alone or in combination with aluminum and/or copper. Pyrolytic graphite is a form of graphite manufactured by decomposition of a hydrocarbon gas at very high temperature resulting in an extremely anisotropic material. Pyrolytic graphite has a high conductivity in the axial direction (i.e., perpendicular to the heat generating source as illustrated in FIG. 2) making it a suitable material for base plate 304.

Figure 4:
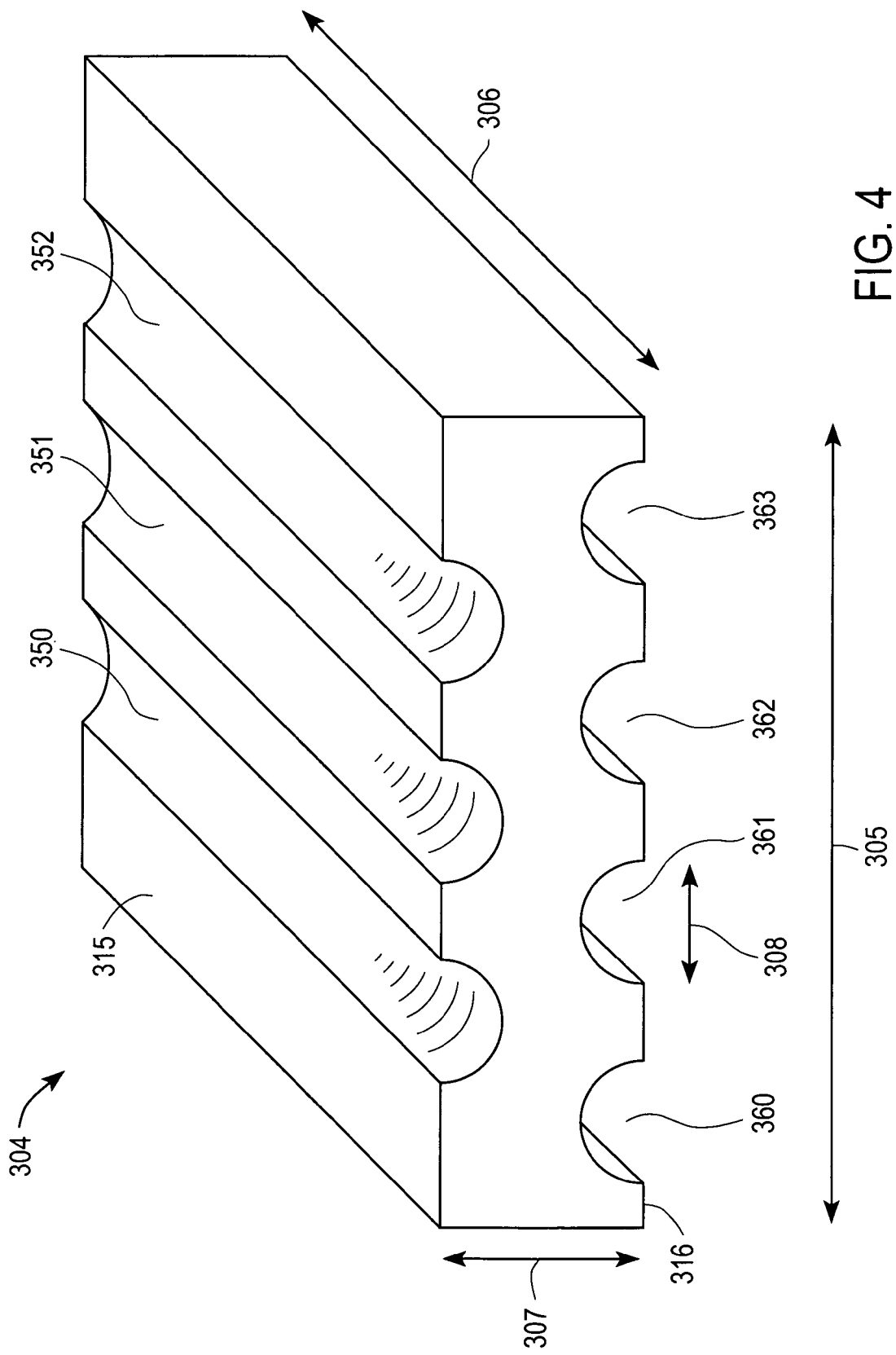
FIG. 4 illustrates one embodiment of base plate for a heat sink.

FIG. 4 illustrates an enlarged view of one embodiment of base plate 304 described above with respect to FIGS. 3A–3D. Base plate 304 has one or more channels formed on a top side 315 and a bottom side 316. For example, top side 315 may have channels 350, 351, and 352. Bottom side 316 may have channels 360, 361, 362, and 363. The channels may extend along an entire length 306 of base plate 304. Although base plate 304 may be any size suitable to be part of a heat sink, base plate 304 may, in one embodiment, have a width 305 of 200 mm, a flow length 306 of 150 mm, and a thickness 307 of 25 mm. Each channel (e.g., 350, 360) may have a diameter of 6–8 mm. As described in greater detail below, each channel may be compatible for housing or coupling to a heat pipe, a fin, or other heat pipe element.

Figure 5A:
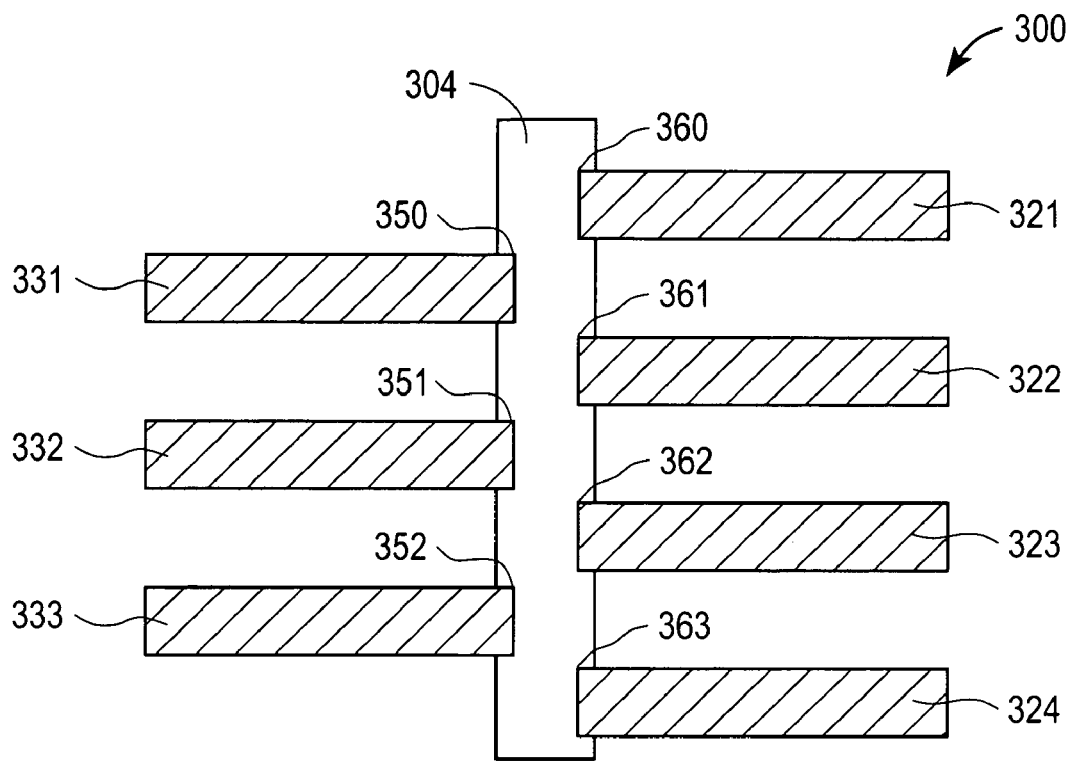
FIG. 5A illustrates a top view of a base plate with fins attached on either side.
Figure 5B:
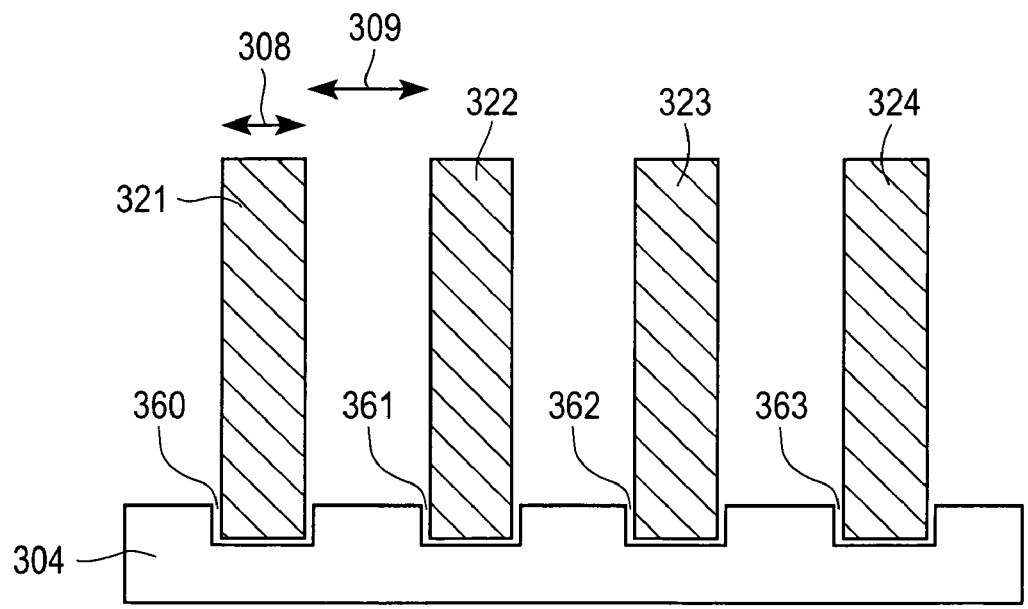
FIG. 5B illustrates an enlarged side-view of fins coupled to one side of a base plate.

FIGS. 5A–5B illustrate one embodiment of an array of fins coupled to base plate 304 described above with respect to FIG. 4. FIG. 5A shows a top view of base plate 304 with fins attached on both sides. In the embodiment shown, the fins are staggered such that a pair of fins (e.g., 321, 331) coupled to base plate 304 are not directly opposite of each other. For example, one side of base plate 304 has fins 321, 322, 323, and 324. The opposite side of base plate 304 has fins 331, 332, and 333. In an alternative embodiment, two fins on opposite sides of each other may be directly aligned with each other (as shown in FIG. 3B). Each fin is coupled to base plate 304 near the channels described above with respect to FIG. 4. For example, fin 321 is coupled to base plate 304 near channel 360, and fin 331 is coupled to base plate 304 near channel 350.

FIG. 5B shows an enlarged side-view of fins coupled to one side of base plate 304. As discussed above, each channel formed within base plate 304 is configured to be compatible with one end of a fin. For example, fin 321 has an end that fits into channel 360. In one embodiment of the present invention, each fin may have a thickness 308 of up to 1 mm and a gap 309 between each fin of up to 2 mm. Up to 70 fins may be disposed on each side of base plate 304 for a total of up to 140 fins. In one embodiment of the present invention, fin 321 may be coupled to base plate 304 by crimping one end of fin 321 into channel 360. In an alternative embodiment, one end of fin 321 may be soldered into channel 360. Methods to couple fins to a base plate are known in the art; accordingly, a detailed description is not provided herein.

Figure 6:
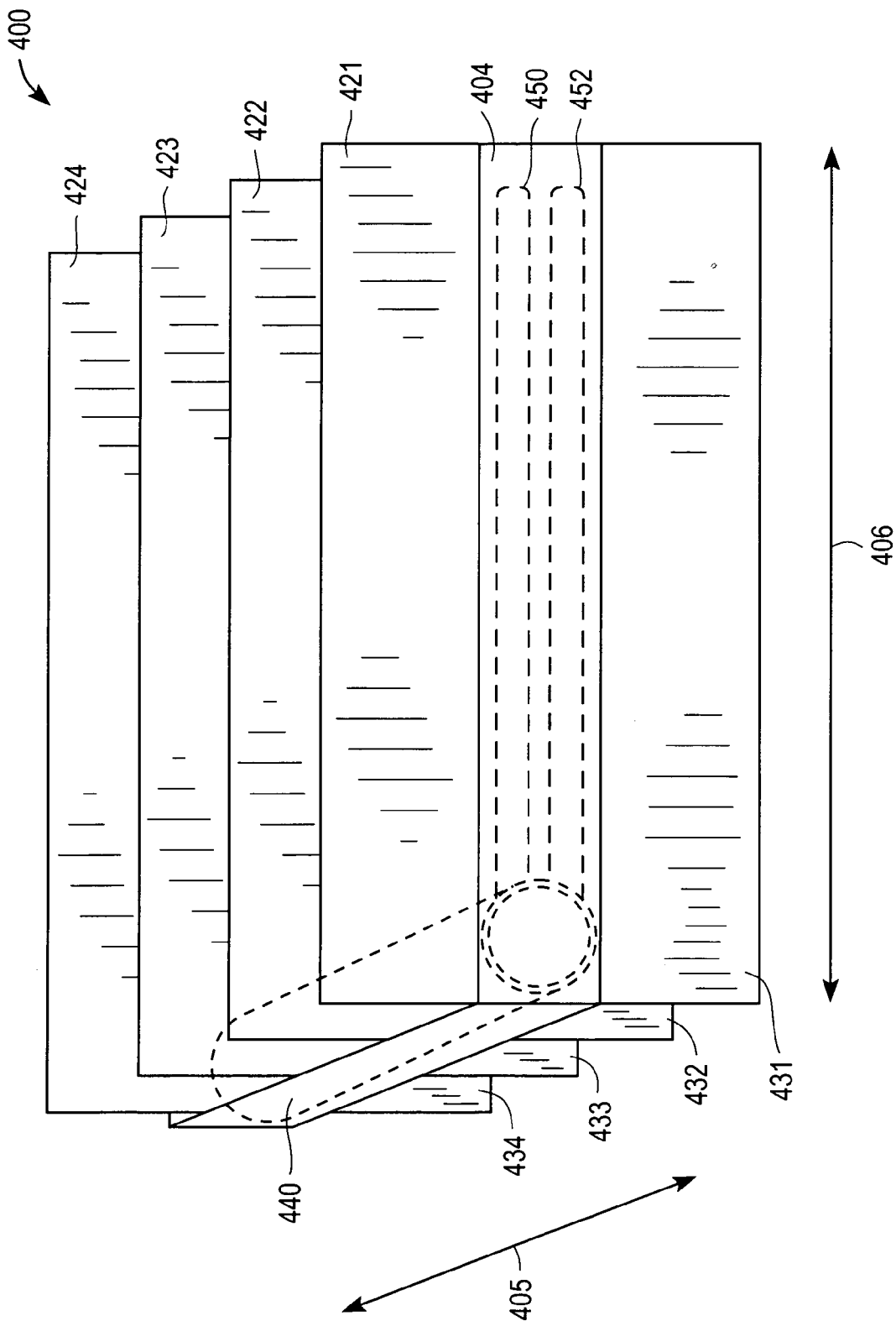
FIG. 6 illustrates a partial see-through view of one embodiment of a heat sink having a base plate with fins coupled to both sides.

FIG. 6 illustrates a partial see-through view of one embodiment of a heat sink 400 having fins (e.g., fins 421–424 and 431–434) coupled to opposite sides of base plate 404. One or more heat pipes may be embedded within base plate 404. For example, a main heat pipe 440 may be disposed within base plate 404 along a width 405. Additional heat pipes (e.g., pipes 450, 452) may be disposed within base plate 404 along a flow length 406 with respect to opposing pairs of fins (e.g., fins 421 and 431). Main heat pipe 440 is disposed near one side of base plate 404, and auxiliary heat pipes 450, 452 are oriented perpendicular to main heat pipe 440 and aligned with opposing fins 421, 431. In one embodiment of the present invention, heat sink 400 is attached to a heat source (e.g., a CPU) such that one end of main heat pipe 440 is oriented directly above the heat source. The heat dissipates through the width 405 of main pipe 440 and along the flow length 406 of each auxiliary heat pipe and out the fins. As discussed in greater detail below, auxiliary heat pipes 450, 452 have combined diameters that are similar to the diameter of main heat pipe 440.

For clarity of description, this particular view of heat sink 400 shows two auxiliary heat pipes 450, 452 in addition to main heat pipe 440. However, an auxiliary heat pipe exists for every fin attached to base plate 404. In alternative embodiments of the present invention, any number of auxiliary heat pipes may be disposed within base plate 404. The combination of heat pipes embedded within base plate 404 and fins coupled to both sides of base plate 404 increases the efficiency of heat dissipation throughout an entire width 405 and flow length 406 of base plate 404 and the fins.

Figure 7A:
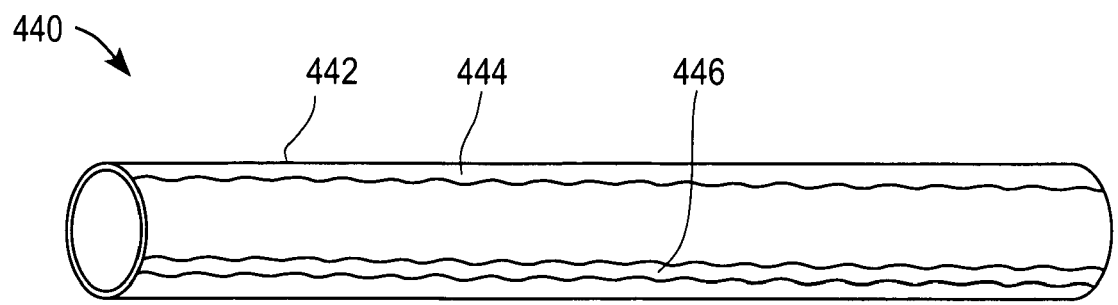
FIG. 7A illustrates a side view of the heat pipe shown in FIG. 6.
Figure 7B:
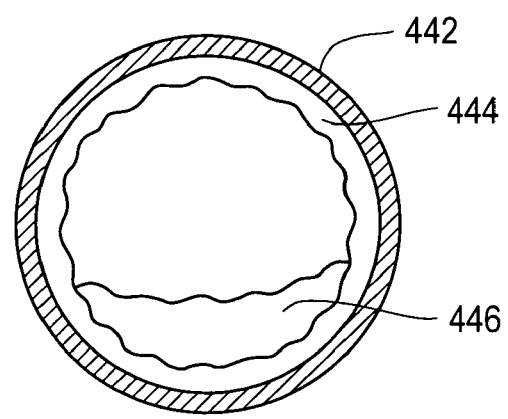
FIG. 7B illustrates a cross-sectional view of the heat pipe shown in FIG. 6.

FIGS. 7A and 7B illustrate isolated views of the heat pipe 440 described above with respect to FIG. 6. In one embodiment of the present invention, the following description of heat pipe 440 may be analogous or applicable to auxiliary heat pipes 450, 452. Heat pipes are typically cylindrical structures containing water. As heat is absorbed within the cylinder, the water boils to a vapor phase and passes through a wick structure lining an inner surface of the pipe. The heat is then released into an outer portion of the cylinder wall and the vapor condenses back into liquid form. Gravity and the condensation of liquid along the wick return the liquid to a lower portion of the cylinder. Heat pipes are well known in the art; accordingly, a detailed description is not provided herein.

FIG. 7A shows a side view of heat pipe 440 having an outer wall 442, a wick 444 disposed along an inside of wall 442 and a cooling material 446 (e.g., $H_2O$) disposed within an inner lumen of heat pipe 440. FIG. 7B shows a cross-sectional view of heat pipe 440 showing the relationship of wall 442, wick 444, and cooling material 446. $H_2O$ and low melt-alloys are just a few examples of a cooling material 446 that may be used with heat pipe 440. Other materials or liquids for cooling material 446 are known in the art; accordingly, a detailed description is not provided herein. As heat passes through heat pipe 440, liquid 446 vaporizes into wick 444 and through wall 442 subsequently spreading out through the fins.

Figure 8:
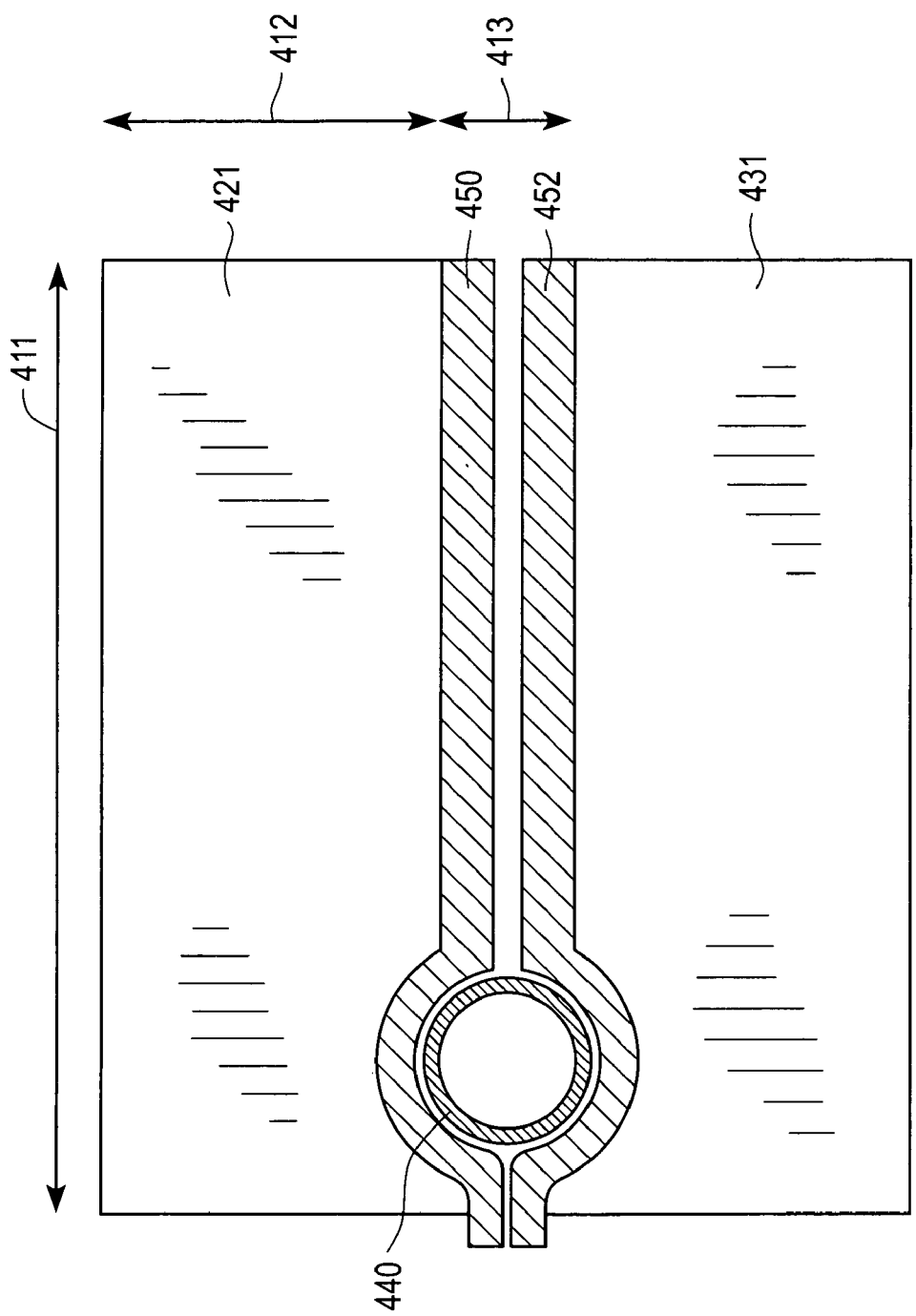
FIG. 8 illustrates a cross-sectional view of the heat sink shown in FIG. 6.

FIG. 8 illustrates a cross-sectional view of heat sink 400 shown in FIG. 6 through a flow length (e.g., 406) of fin 421, auxiliary heat pipes 450, 452, and fin 431. This cross-section of base plate 404 shows, in one embodiment, the orientation of main heat pipe 440 and auxiliary heat pipes 450, 452, with main heat pipe 440 disposed near one side of the base plate (not shown). The cylindrical structures of main heat pipe 440 and auxiliary heat pipes 450, 452 have closed ends. Auxiliary heat pipes are separated by a fixed distance from each other throughout a flow length with ends that partially wrap around main heat pipe 440. This structural configuration of auxiliary heat pipes with respect to main heat pipe 440 allows heat to be transferred efficiently from main heat pipe to an entire flow length of each auxiliary heat pipe. As discussed above, fins 421, 431 have a flow length 411 and a flow height 412 corresponding to the dimensional length and width of each fin. Main heat pipe has a diameter 413 that may be substantially similar to the combined diameters of auxiliary heat pipes 450, 452.

In one embodiment of the present invention, heat fins 421 and 431 are substantially similar in size and shape having a flow length 411 of up to 300 mm, and a flow height 412 of up to 75 mm. Main heat pipe 440 may have a diameter 413 of up to 30 mm. In an alternative embodiment, heat fins 421, 431 and main heat pipe 440 may have other dimensions.

Figure 9A:
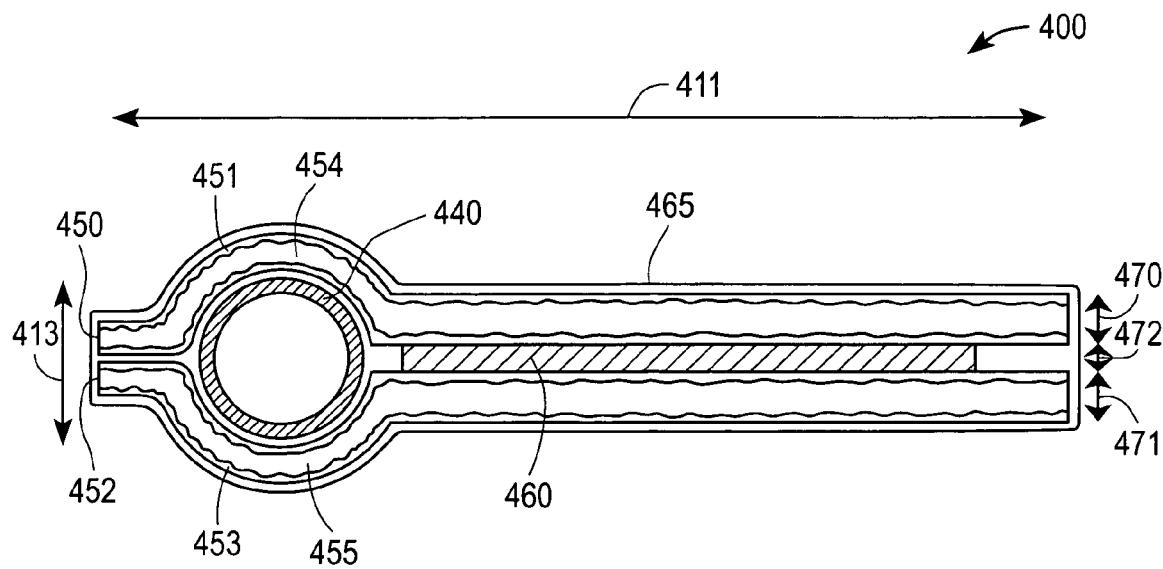
FIG. 9A illustrates an enlarged cross-sectional view of a main heat pipe and auxiliary heat pipes.

FIG. 9A illustrates an enlarged cross-sectional view of heat sink 400 through main heat pipe 440 and auxiliary heat pipes 450, 452, but without fins 421, 431. One end portion of each auxiliary heat pipe 450, 452 wraps partially around main heat pipe 440. Each auxiliary heat pipe has a diameter that is less than the diameter of main heat pipe 440 and includes wick structures 451, 453 that form channels 454, 455. The heat pipes are held together by a wrap-around plate 465 that covers the outer dimensions of auxiliary heat pipes 450, 452. In one embodiment of the present invention, wrap-around plate 465 may be the base plate discussed herein (e.g., base plates 304, 404). Wrap-around plate 465 is made of a heat conducting material such as aluminum or copper.

In one embodiment of the present invention, main heat pipe 440 may have a diameter 414 of 25 mm and auxiliary heat pipe 450 may have diameters 470, 471 of up to 10 mm. The combined length 411 (i.e., heat flow length) of main heat pipe 440 and auxiliary heat pipes 450, 452 as shown in this cross-section may be approximately 200 mm. Auxiliary heat pipes 450, 452 are separated by a distance 472, and in one embodiment, may be separated by a heat conducting spacer 460 having a thickness of up to 6 mm. In one alternative embodiment of the present invention, heat conducting spacer 460 may be an aluminum heat spreader.

Figure 9B:
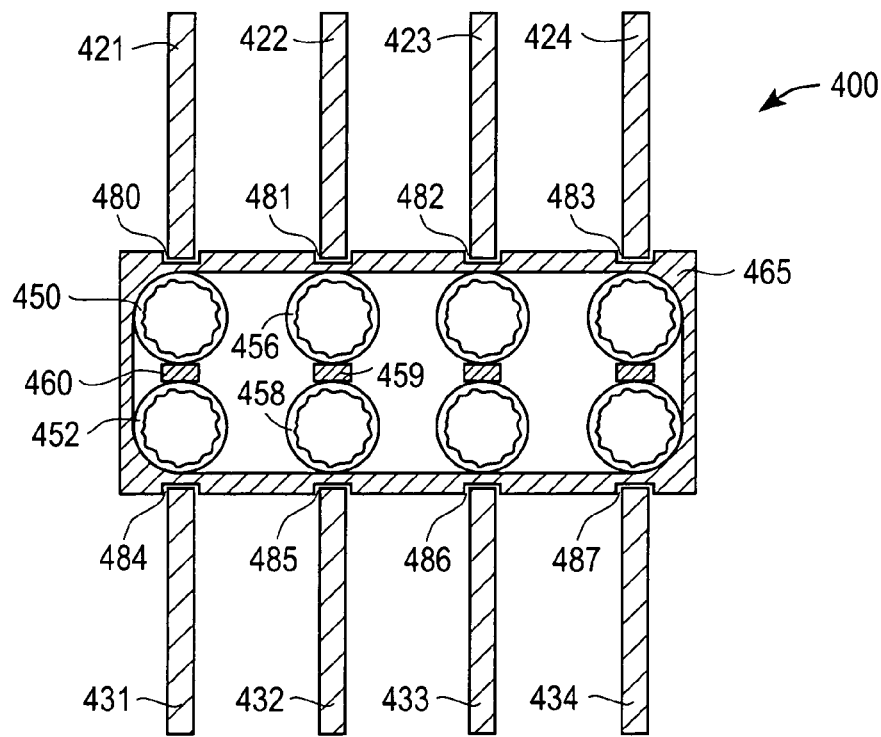
FIG. 9B illustrates another enlarged cross-sectional view of a main heat pipe and auxiliary heat pipes.

FIG. 9B illustrates a cross-sectional view of heat sink 400 that is perpendicular to the flow length cross-sectional view shown with respect to FIG. 9A. Four pairs of auxiliary heat pipes are covered by wrap-around plate 465. Auxiliary heat pipes are represented by reference numerals 450, 452, 456, and 458. Each pair of auxiliary heat pipes are separated by a heat spreader (e.g., 459, 460). Fins 421–424 are attached to one side of wrap-around plate 465 and fins 431–434 are attached to the opposite side of wrap-around plate 465. Grooves or channels 480–483 are formed on an outer surface of wrap-around plate 465 for fins 421–424 and channels 484–487 are formed for fins 431–434. In one alternative embodiment, channels 480–483 and 484–487 may be similar to channels 350–352 and 360–363 described above with respect to FIG. 4.

Figure 10:
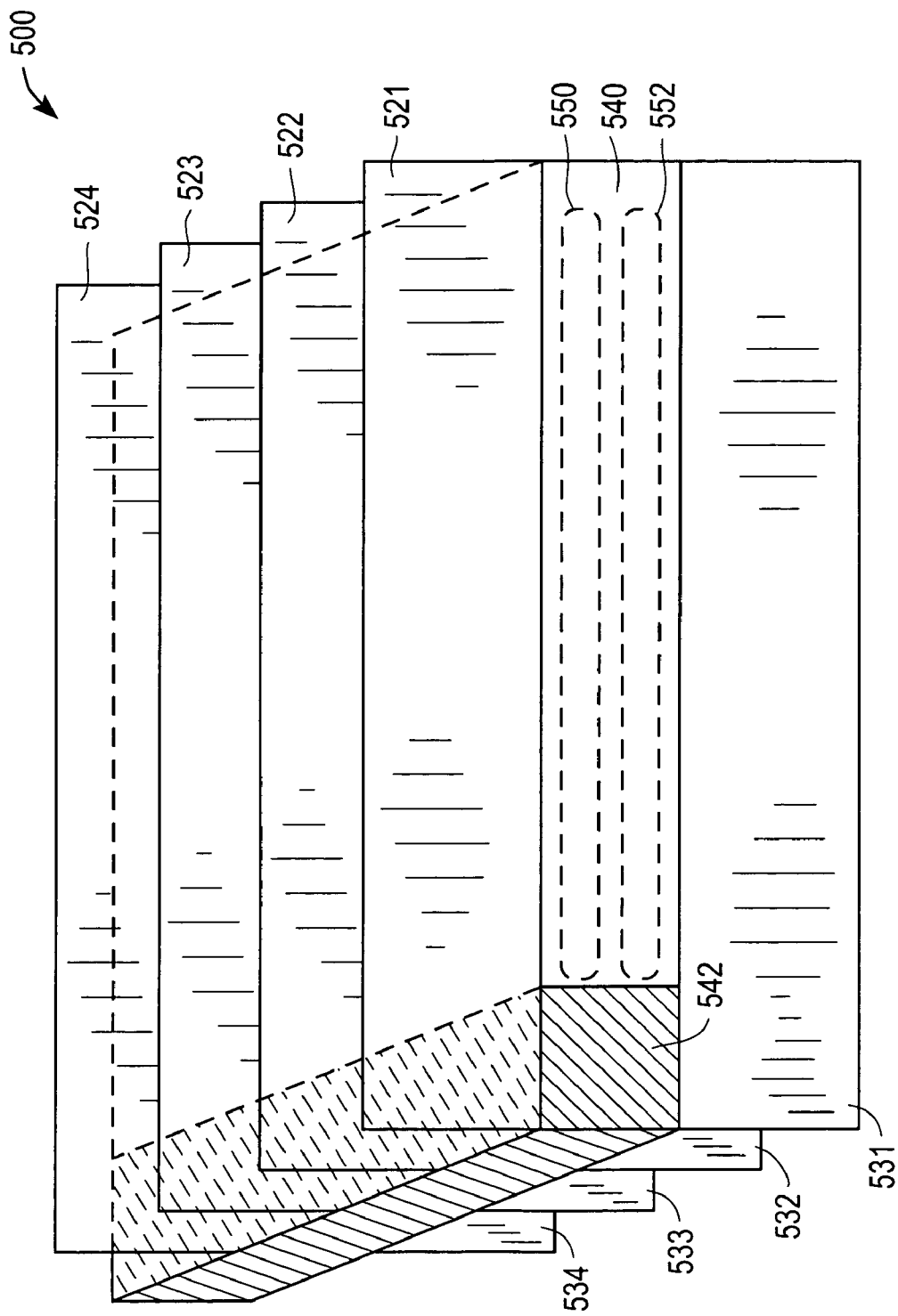
FIG. 10 illustrates an alternative embodiment of a heat sink.

As discussed above, the base plate or the wrap-around plate is made of a high heat conducting material such as aluminum or copper. In one alterative embodiment of the present invention, the base plate may be made of multiple materials that provide an advantage over a single, uniform material. FIG. 10 illustrates an alternative embodiment of a heat sink 500 having fins 521–524 and 531–534 disposed on opposite sides of base plate 540. A portion 542 of base plate 540 is made of pyrolytic graphite while the remainder of base plate 540 is made of a different heat conducting material such as aluminum or copper. Portion 542 of base plate 540 may be extruded during the base plate manufacturing process to produce this combination. Base plate 540 may also include multiple auxiliary heat pipes 550, 552 to help dissipate the heat along the flow length of base plate 540 and to the double sided fins. Auxiliary heat pipes may be embedded within base plate 540 for every fin coupled to base plate 540. In an alternative embodiment of heat sink 500, auxiliary heat pipes may not be necessary. Because pyrolytic graphite has a high conductivity in the axial direction, portion 542 may be disposed directly over a heat source (e.g., a CPU), thereby allowing the heat to dissipate to all the fins along the heat flow length that is perpendicular to portion 542. Heat sink 500 may have a network of heat pipes (e.g., a main heat pipe and auxiliary heat pipes discussed above with respect to FIGS. 6–9B).

Figure 11:
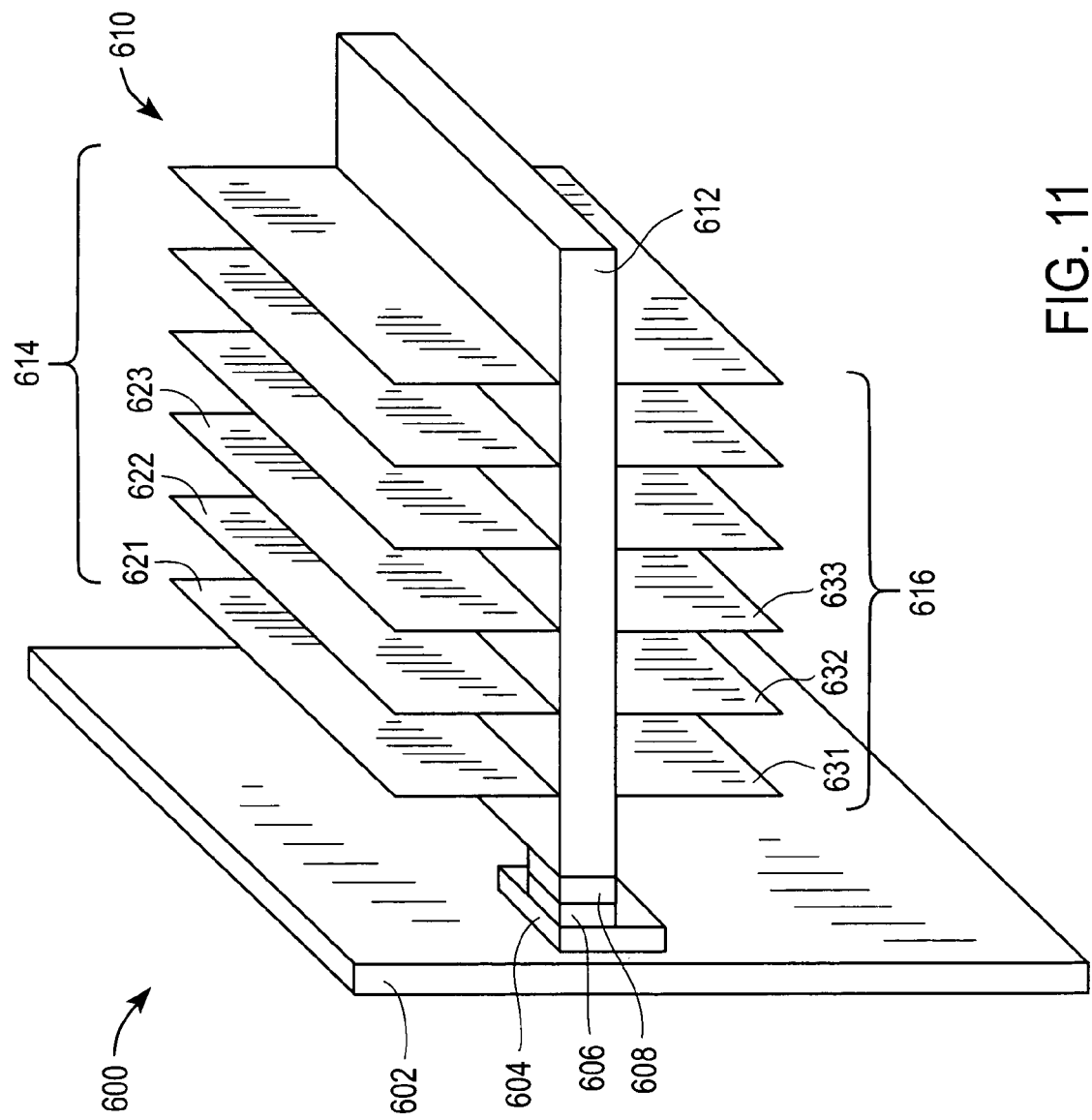
FIG. 11 illustrates one embodiment of a computer assembly having a cooling system.

FIG. 11 illustrates one embodiment of a computer assembly 600 having a cooling system. In particular, the cooling system 610 dissipates heat generated by a CPU disposed on a mother board. FIG. 11 illustrates an internal view of the computer chassis with motherboard 602 in a vertical position. A substrate 604 (e.g., a silicon substrate) is disposed on motherboard 602. The heat generating CPU 606 is disposed above substrate 604. A heat spreading element or slug 608 is disposed above CPU 606. As discussed above, heat spreader 608 in one embodiment, may be made of a heat conducting material such as copper that spreads heat from CPU 606 to heat sink 610. Heat sink 610 is disposed above slug 608 with base plate portion 612 extending perpendicularly from motherboard 602. It should be noted that the computer assembly illustrated in FIG. 11 is not necessarily drawn to scale. In particular, heat sink 610 has been enlarged to provide a better understanding of its structure and orientation.

Multiple fins 614 and 616 are disposed on both sides of base plate 612. Fins 621, 622, and 623 are representative of fins disposed on one side of base plate 610, and fins 631, 632, and 633 are representative of fins disposed on the opposite side of base plate 612. Any number of fins may be disposed on both sides of base plate 612 and is not limited to the number a fins illustrated with respect to FIG. 11. One or more heat pipes (not shown) may be embedded within base plate 612, as discussed above with respect to FIGS. 6, 7A, and 7B. For example, a main heat pipe (not shown) may be disposed along a width of base plate in addition to one or more auxiliary heat pipes (not shown) extending along a flow length of base plate 612 between opposing fins (e.g., fins 612 and 631). Base plate 612 is coupled to heat spreader 608 near a corner portion of base plate 612. This relative position of base plate 612 to heat spreader 608 allows the heat generated by CPU to spread efficiently throughout heat sink 610. In one embodiment of the present invention, the main heat pipe may be embedded within base plate 612 such that it aligns over heat spreader 608 and CPU 606. A cooling fan (also not shown) may be disposed near heat sink 610 to force air through the fins of heat sink 610 in the direction indicated by arrows 640. As such, in one embodiment, heat dissipates from CPU 606 efficiently towards the outer dimensions of all the fins disposed on both sides of base plate 612.

Figure 12:
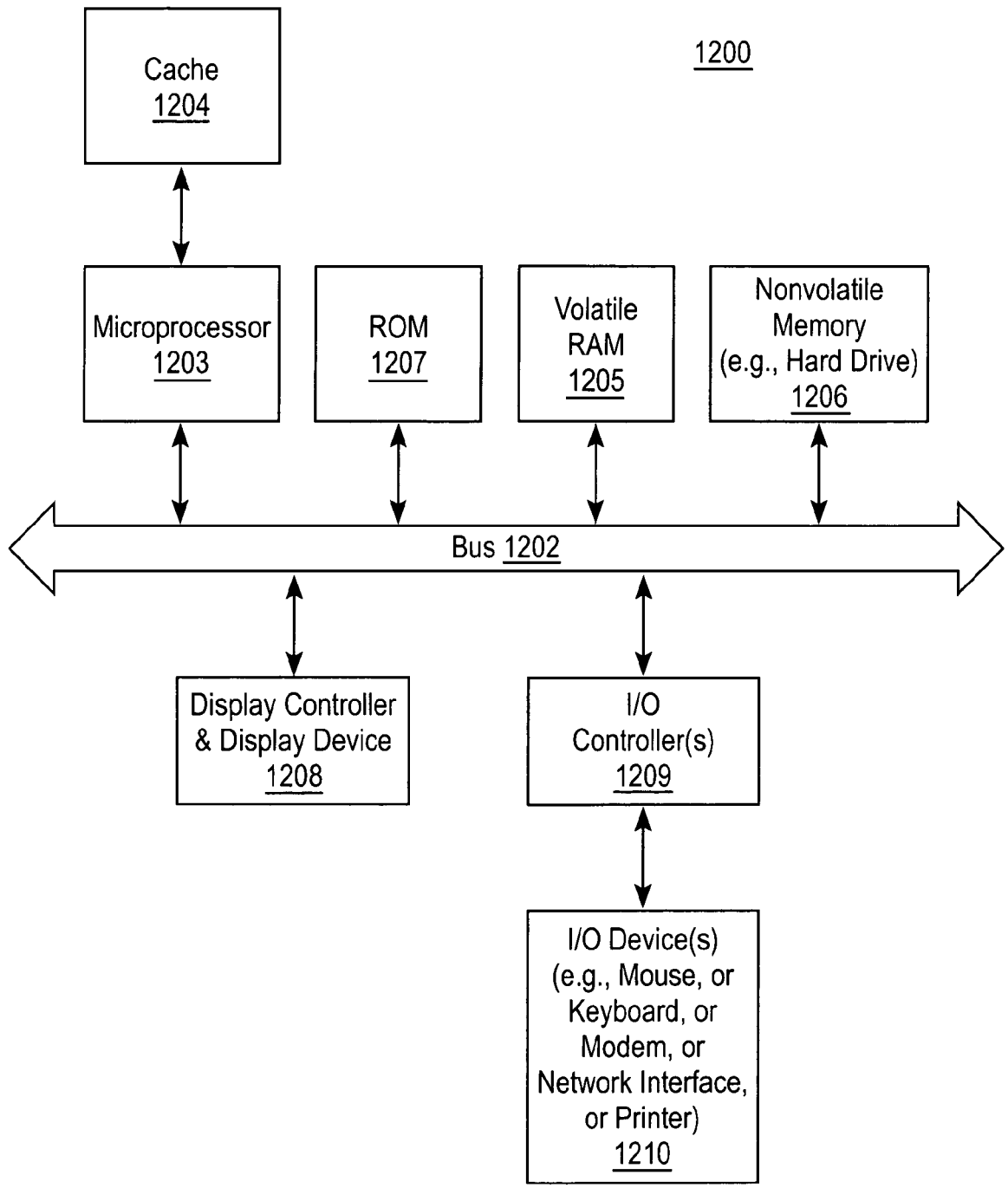
FIG. 12 illustrates a block diagram of a computer which may be used with an embodiment of the present invention.

FIG. 12 is a block diagram of a computer which may be used with an embodiment of the present invention. In one embodiment, exemplary system 1200 includes a processor having one or more arithmetic logical units ("ALUs"), a process executed by the processor from a memory. Note that while FIG. 12 illustrates various components of a computer system, it is not intended to represent any particular architecture or manner of interconnecting the components, as such details are not germane to the present invention. It will also be appreciated that network computers, handheld computers, cell phones, and other data processing systems which have fewer components or perhaps more components may also be used with the present invention.

As shown in FIG. 12, the computer system 1200, which is a form of a data processing system, includes a bus 1202 which is coupled to a microprocessor 1203 and a ROM 1207, a volatile RAM 1205, and a non-volatile memory 1206. The microprocessor 1203, which may be a G-Series processor from Apple Computer, Inc., of Cupertino, Calif., U.S.A., is coupled to cache memory 1204 as shown in the example of FIG. 12. The bus 1202 interconnects these various components together and also interconnects these components 1203, 1207, 1205, and 1206 to a display controller and display device 1208, as well as to input/output (I/O) devices 1210, which may be mice, keyboards, modems, network interfaces, printers, and other devices which are well-known in the art. Typically, the input/output devices 1210 are coupled to the system through input/output controllers 1209. The volatile RAM 1205 is typically implemented as dynamic RAM (DRAM) which requires power continuously in order to refresh or maintain the data in the memory. The non-volatile memory 1206 is typically a magnetic hard drive, a magnetic optical drive, an optical drive, or a DVD RAM or other type of memory system which maintains data even after power is removed from the system. Typically the non-volatile memory will also be a random access memory, although this is not required. While FIG. 12 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 1202 may include one or more buses connected to each other through various bridges, controllers, and/or adapters, as is well-known in the art. In one embodiment, the I/O controller 1209 includes a Universal Serial Bus ("USB") adapter for controlling USB peripherals.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A heat sink, comprising:
   a main heat pipe;
   a plurality of auxiliary heat pipes coupled to said main heat pipe;
   a wrap-around plate that covers said main heat pipe and said plurality of auxiliary heat pipes; and
   a plurality of fins coupled to opposite sides of said wrap-around plate and aligned with said plurality of auxiliary heat pipes, wherein pairs of auxiliary heat pipes disposed near opposite sides of said wrap-around plate are aligned along a length of said main heat pipe.

2. A heat sink, comprising:
   a main heat pipe;
   a plurality of auxiliary heat pipes coupled to said main heat pipe;
   a wrap-around plate that covers said main heat pipe and said plurality of auxiliary heat pipes; and
   a plurality of fins coupled to opposite sides of said wrap-around plate and aligned with said plurality of auxiliary heat pipes, wherein pairs of auxiliary heat pipes disposed near opposite sides of said wrap-around plate are aligned along a length of said main heat pipe, and wherein each auxiliary heat pipe has a diameter that is less than a diameter of said main heat pipe.

3. A heat sink, comprising:
   a main heat pipe;
   a plurality of auxiliary heat pipes coupled to said main heat pipe;
   a wrap-around plate that covers said main heat pipe and said plurality of auxiliary heat pipes; and
   a plurality of fins coupled to opposite sides of said wrap-around plate and aligned with said plurality of auxiliary heat pipes, wherein pairs of auxiliary heat pipes disposed near opposite sides of said wrap-around plate are aligned along a length of said main heat pipe, and wherein each fin is aligned with each auxiliary heat pipe along a flow length.

4. A heat sink, comprising:
   a main heat pipe;
   a plurality of auxiliary heat pipes coupled to said main heat pipe;
   a wrap-around plate that covers said main heat pipe and said plurality of auxiliary heat pipes; and
   a plurality of fins coupled to opposite sides of said wrap-around plate and aligned with said plurality of auxiliary heat pipes, wherein pairs of auxiliary heat pipes disposed near opposite sides of said wrap-around plate are aligned along a length of said main heat pipe and each auxiliary heat pipe has a diameter that is less than a diameter of said main heat pipe, and wherein each auxiliary heat pipe has an end portion that wraps partially around said main heat pipe.

* * * * *